(12) United States Patent
Mikami

(10) Patent No.: US 10,446,501 B2
(45) Date of Patent: Oct. 15, 2019

(54) SEMICONDUCTOR DEVICE, METHOD OF POSITIONING SEMICONDUCTOR DEVICE, AND POSITIONING APPARATUS FOR SEMICONDUCTOR DEVICE

(71) Applicant: OLYMPUS CORPORATION, Tokyo (JP)

(72) Inventor: Masato Mikami, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 15/885,033

(22) Filed: Jan. 31, 2018

(65) Prior Publication Data

US 2018/0174978 A1 Jun. 21, 2018

Related U.S. Application Data

(63) Continuation of application No. 14/277,217, filed on May 14, 2014, now abandoned.

(30) Foreign Application Priority Data

May 20, 2013 (JP) .................................. 2013-106330

(51) Int. Cl.
*H01L 23/544* (2006.01)
*H01L 23/00* (2006.01)

(52) U.S. Cl.
CPC ............ *H01L 23/544* (2013.01); *H01L 24/81* (2013.01); *H01L 2223/5442* (2013.01);
(Continued)

(58) Field of Classification Search
CPC ....... H01L 23/544; H01L 23/81; H01L 24/81; H01L 2223/5442; H01L 2223/54426;
(Continued)

(56) References Cited

U.S. PATENT DOCUMENTS 4,686,565 A 8/1987 Ando
5,150,280 A 9/1992 Arai et al.
(Continued)

FOREIGN PATENT DOCUMENTS

JP S60-247106 A 12/1985
JP H01-215034 A 8/1989
(Continued)

OTHER PUBLICATIONS

Japanese Office Action dated Jan. 31, 2017 in Japanese Patent Application No. 2013-106330.
(Continued)

*Primary Examiner* — Dale E Page
*Assistant Examiner* — Quovaunda Jefferson
(74) *Attorney, Agent, or Firm* — Scully Scott Murphy & Presser, P.C.

(57) ABSTRACT

A semiconductor device includes: a semiconductor chip that has a first connection terminal for wiring connection; a substrate that has a second connection terminal for wiring connection, the second connection terminal being electrically connected to the first connection terminal; and a reflective surface that reflects light from the first connection terminal and the second connection terminal in a thickness direction of the substrate or the semiconductor chip.

3 Claims, 7 Drawing Sheets

(52) U.S. Cl.
CPC ............... *H01L 2223/54426* (2013.01); *H01L 2223/54473* (2013.01); *H01L 2223/54486* (2013.01); *H01L 2224/131* (2013.01); *H01L 2224/133* (2013.01); *H01L 2224/1329* (2013.01); *H01L 2224/81121* (2013.01); *H01L 2924/014* (2013.01); *H01L 2924/12042* (2013.01)

(58) Field of Classification Search
CPC . H01L 2223/54473; H01L 2223/54486; H01L 2224/131; H01L 2224/133; H01L 2224/1329; H01L 2224/12042; H01L 2224/014
See application file for complete search history.

(56) References Cited

U.S. PATENT DOCUMENTS

| | | | |
|---|---|---|---|
| 6,146,912 | A | 11/2000 | Tighe et al. |
| 2001/0024273 | A1 | 9/2001 | Cannon |
| 2002/0062787 | A1* | 5/2002 | Hashizume ......... B32B 38/1841 118/664 |
| 2002/0140107 | A1 | 10/2002 | Kato et al. |
| 2006/0202359 | A1 | 9/2006 | Chen |
| 2008/0073027 | A1 | 3/2008 | Yamauchi et al. |
| 2008/0225252 | A1 | 9/2008 | Oudshoorn et al. |
| 2010/0093131 | A1 | 4/2010 | Maeda |
| 2011/0043622 | A1 | 2/2011 | Motohara |

FOREIGN PATENT DOCUMENTS

| | | |
|---|---|---|
| JP | H02-058345 A | 2/1990 |
| JP | H04-132707 U | 12/1992 |
| JP | H06-302648 A | 10/1994 |
| JP | H10-012661 A | 1/1998 |
| JP | 11-330347 A | 11/1999 |
| JP | 2000-131029 A | 5/2000 |
| JP | 2003-068793 A | 3/2003 |
| JP | 2005-197355 A | 7/2005 |
| JP | 2007-306031 A | 11/2007 |
| JP | 2009-194119 A | 8/2009 |
| JP | 2009-260213 A | 11/2009 |
| JP | 2012-253197 A | 12/2012 |

OTHER PUBLICATIONS

Decision to Grant a Patent dated Oct. 10, 2017 in Japanese Patent Application No. 2013-106330.

Office Action dated Jul. 29, 2016 received in U.S. Appl. No. 14/277,217.

Office Action dated Jan. 4, 2016 received in U.S. Appl. No. 14/277,217.

Office Action dated Mar. 23, 2017 received in U.S. Appl. No. 14/277,217.

Office Action dated Jul. 1, 2015 received in U.S. Appl. No. 14/277,217.

* cited by examiner

SEMICONDUCTOR DEVICE, METHOD OF POSITIONING SEMICONDUCTOR DEVICE, AND POSITIONING APPARATUS FOR SEMICONDUCTOR DEVICE

CROSS-REFERENCE TO RELATED APPLICATIONS

This application is a continuation of U.S. patent application Ser. No. 14/277,217, filed May 14, 2014, which is based upon and claims the benefit of priority from Japanese Patent Application No. 2013-106330, filed on May 20, 2013, the entire contents of each are incorporated herein by reference.

BACKGROUND

1. Technical Field

The disclosure relates to a semiconductor device, a method of positioning the semiconductor device, and a positioning apparatus for the semiconductor device.

2. Related Art

When a semiconductor chip is connected to a mount substrate to manufacture a semiconductor device, positioning between the semiconductor chip and the mount substrate is performed, based on an alignment mark formed on the semiconductor chip and/or the mount substrate, conventionally.

As techniques of performing positioning highly accurately by using an alignment mark: a technique of forming, in a region around an alignment mark of a semiconductor substrate, a sloped region that is sloped with respect to a normal direction of the substrate, to thereby reduce a normal direction reflectivity of laser light irradiated from the normal direction to the sloped region and precisely detect the alignment mark (for example, see Japanese Laid-open Patent Application No. 11-330347); and a technique of making a contrast difference between an alignment mark and a background region uniform to thereby improve visibility of the alignment mark (for example, see Japanese Laid-open Patent Application No. 2009-194119), are disclosed.

SUMMARY

In some embodiments, a semiconductor device includes: a semiconductor chip that has a first connection terminal for wiring connection; a substrate that has a second connection terminal for wiring connection, the second connection terminal being electrically connected to the first connection terminal; and a reflective surface that reflects light from the first connection terminal and the second connection terminal in a thickness direction of the substrate or the semiconductor chip.

In some embodiments, a method of positioning a semiconductor device in which a semiconductor chip and a substrate are connected to each other includes the steps of: first positioning of positioning in a field of view of an imaging device a reflective surface that reflects light from a first connection terminal of the semiconductor chip for wiring connection; and second positioning of positioning the substrate according to an image of a second connection terminal of the substrate for wiring connection and an image of the first connection terminal, both of the images being projected on the reflective surface.

In some embodiments, a positioning apparatus for a semiconductor device is provided. The semiconductor device includes: a semiconductor chip having a first connection terminal for wiring connection; a substrate having a second connection terminal for wiring connection, the second connection terminal being electrically connected to the first connection terminal; and a reflective surface that reflects light. The positioning apparatus includes: a stage that fixes the semiconductor chip having the first connection terminal for wiring connection and is movable within one plane; a tool that suctions and fixes the substrate having the second connection terminal for wiring connection and mounts the substrate on the semiconductor chip; an imaging device that images a reflective surface for projecting images of the first connection terminal and the second connection terminal; and a control unit that controls movement of the stage based on the images of the first connection terminal and the second connection terminal that are projected on the reflective surface, the images having been imaged by the imaging device.

The above and other features, advantages and technical and industrial significance of this invention will be better understood by reading the following detailed description of presently preferred embodiments of the invention, when considered in connection with the accompanying drawings.

DETAILED DESCRIPTION

Hereinafter, with reference to the appended drawings, modes for carrying out the present invention (hereinafter, referred to as "embodiments") will be described. The present invention is not limited by the embodiments. Further, in describing the drawings, the same portions are appended with the same reference signs. Further, the drawings are schematic, and it is to be noted that the relation between the thickness and width of each component and the ratios among the respective components are different from the actual. Further, a portion is included, which has different size relations and ratios among the drawings.

First Embodiment

Figure 1:
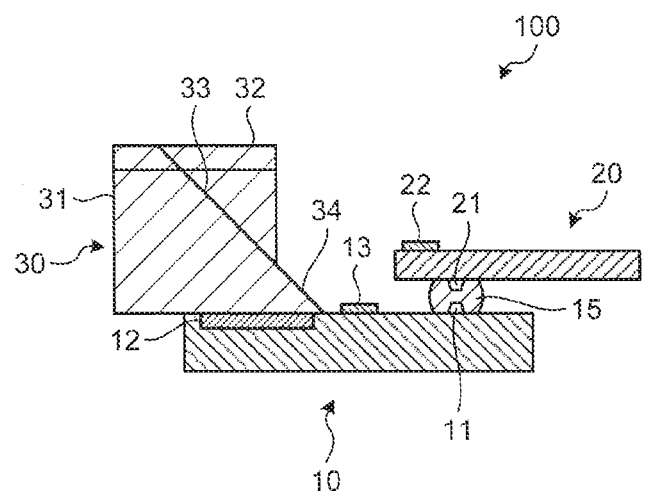
FIG. 1 is a cross section diagram of a semiconductor device according to a first embodiment of the present invention.
Figure 2:
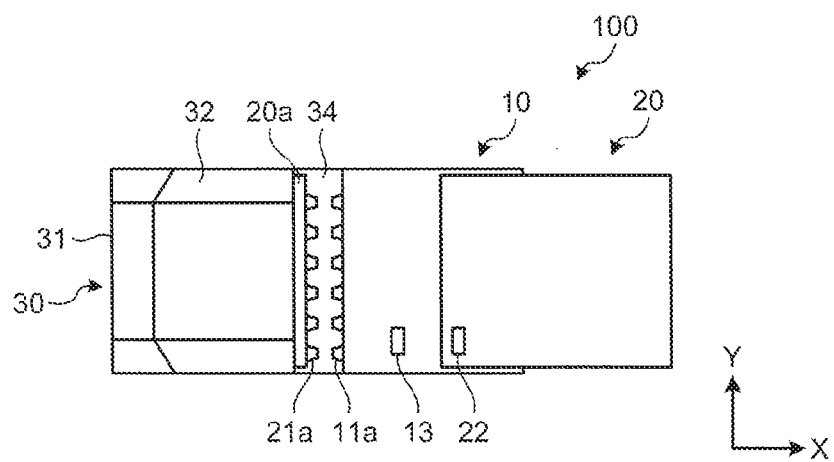
FIG. 2 is a top view before connection of the semiconductor device of FIG. 1.

FIG. 1 is a cross section diagram illustrating a semiconductor device 100 according to a first embodiment of the present invention. FIG. 2 is a top view before connection of the semiconductor device 100 of FIG. 1. The semiconductor device 100 according to the first embodiment of the present invention includes: a semiconductor chip 10, which is a solid-state image sensing element; a mount substrate 20; and a prism 30 that emits light incident from an imaging optical system to the semiconductor chip 10.

In the semiconductor chip 10, a first connection terminal 11 for wiring connection, an imaging region 12 that converts an optical signal input from the prism 30 to an electric signal, and an alignment mark 13 are formed on a same surface.

In the mount substrate 20, a second connection terminal 21 for wiring connection is formed, and an alignment mark 22, which is on a reverse side of a surface on which the second connection terminal 21 is formed, is formed. The first connection terminal 11 and second connection terminal 21 are bumps formed by screen printing, plating, or the like.

The prism 30 has a first prism 31 and a second prism 32, reflects, by a connection surface 33 between the first prism 31 and second prism 32, light incident on the first prism 31 from a non-illustrated imaging optical system, and emits the reflected light to the imaging region 12. A sloped surface of the first prism 31 and not contacting the second prism 32 forms a reflective surface 34 that reflects light from the first connection terminal 11 and second connection terminal 21.

As illustrated in FIG. 2, the reflective surface 34 is formed at a position such that the reflective surface 34 is able to reflect the light from the first connection terminal 11 and second connection terminal 21 in a thickness direction of the mount substrate 20, and the reflective surface 34 projects thereon an image 11a of the first connection terminal 11 and an image 21a of the second connection terminal 21. By visually recognizing the image 11a and image 21a projected on the reflective surface 34 from above, that is, from the reverse side of a connection surface of the mount substrate 20, positioning of the semiconductor chip 10 and mount substrate 20 is possible. Further, in the first embodiment, the semiconductor chip 10 and the mount substrate 20 are formed respectively with the alignment marks 13 and 22, and after roughly adjusting positions of the semiconductor chip 10 and mount substrate 20 using the alignment marks 13 and 22, the positions of the semiconductor chip 10 and mount substrate 20 are finely adjusted using the image 11a and image 21a projected on the reflective surface 34, and thus highly accurate positioning is possible in a short period of time. In FIG. 2, the reflective surface 34 projects thereon the image 11a of the first connection terminal 11, the image 21a of the second connection terminal 21, and an image 20a of a part of the mount substrate 20, but the reflective surface 34 may just have an area that allows projection of at least the image 11a of the first connection terminal 11 and the image 21a of the second connection terminal 21 in the thickness direction of the mount substrate.

The semiconductor chip 10 and the mount substrate 20 are connected in parallel by a connection material 15 such as a soldering paste, an anisotropic conductive film (ACF), an anisotropic conductive paste), or the like, such that the first connection terminal 11 and the second connection terminal 21 face each other.

Figure 3:
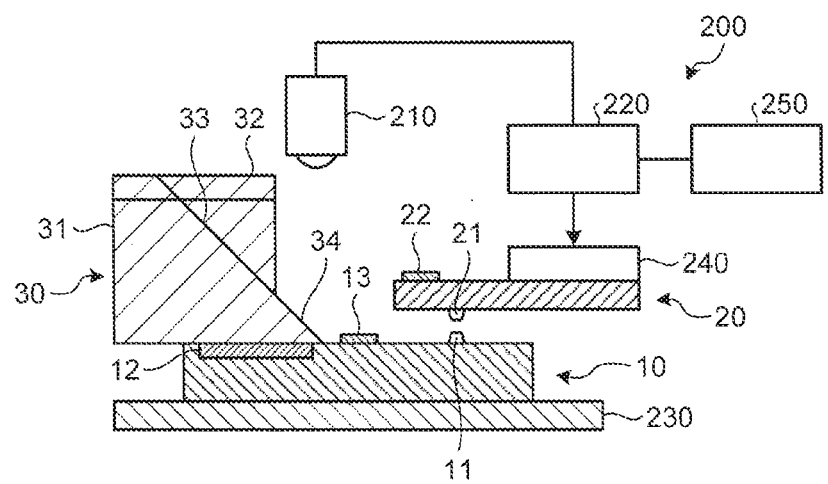
FIG. 3 is a block diagram illustrating a positioning apparatus for the semiconductor device according to the first embodiment of the present invention.

Next, a manufacturing method and a manufacturing device for the semiconductor device 100 according to the first embodiment are described. FIG. 3 is a block diagram illustrating a positioning apparatus for the semiconductor device 100 according to the first embodiment of the present invention.

A positioning apparatus 200 for the semiconductor device 100 includes: an imaging device 210 such as a CCD that captures the image 11a of the first connection terminal 11 and the image 21a of the second connection terminal 21 that are projected on the reflective surface 34; a control unit 220 that performs control of each unit; a stage 230 that fixes the semiconductor chip 10 and is able to move the fixed semiconductor chip 10 in one plane (X-direction, Y-direction, and θ-direction); a tool 240 that holds the mount substrate 20 and mounts the held mount substrate 20 on the semiconductor chip 10 fixed on the stage 230; and a display unit 250 that outputs an image captured by the imaging device 210.

The imaging device 210 is fixed above the mount substrate 20 that is to be positioned, and the imaging device 210 captures the image 11a of the first connection terminal 11 and the image 21a of the second connection terminal 21, which are projected on the reflective surface 34. Further, the imaging device 210 outputs the captured images to the control unit 220. The imaging device 210 preferably has an angle change mechanism that is able to make adjustment according to an angle of the reflective surface 34 and a vertical axis Z adjustment mechanism for adjusting a focus point.

When image data are input by the imaging device 210, the control unit 220 performs the positioning of the semiconductor chip 10 and mount substrate 20 by performing a pattern matching process, focus adjustment, and the like on the image data. Further, the control unit 220 outputs the image data input from the imaging device 210 to the display unit 250.

The control unit 220 may be one that controls a non-illustrated coating mechanism for the connection material 15. Above the semiconductor chip 10, the coating mechanism for the connection material 15 is fixed in a retractable manner and the coating mechanism supplies the connection material 15 to a connection part of the semiconductor chip 10, that is, onto the first connection terminal 11, by a discharge device, such as a syringe. The coating mechanism preferably has a temperature control device, a displacement meter, and the like, for the syringe or the like. The coating mechanism may be configured to perform coating of the connection material on a specified position by image recognition using the imaging device 210 and control unit 220, instead of using the displacement meter. A positioning process by the imaging device 210 and the control unit 220 is performed after the coating mechanism is retracted from above the semiconductor chip 10.

The stage 230 moves on the one plane (X-direction, Y-direction, and θ-direction), under control of the control unit 220, to place the semiconductor chip 10 to a specified position by suctioning and fixing the semiconductor chip 10.

Under the control of the control unit 220, the tool 240 picks up the mount substrate 20 by suction-fixing the mount substrate 20 using a suction unit or the like and mounts the picked up mount substrate 20 on the semiconductor chip 10 fixed on the stage 230. For the movement of the semiconductor chip 10 and mount substrate 20 by the stage 230 and tool 240, a servomotor is used.

When the control unit 220 determines, by using the pattern matching process, that the semiconductor chip 10 and the mount substrate 20 are not at the specified positions, the tool 240 moves, under the control of the control unit 220, the mount substrate 20 fixed by the suction unit or the like to the specified position with respect to the semiconductor chip 10.

The positioning of the semiconductor chip 10 and the mount substrate 20 by the positioning apparatus 200 may be automatically performed by software built in the control unit 220 or operated manually based on an image displayed on the display unit 250. Further, the coating of the connection material 15 by the coating mechanism and the movement of the semiconductor chip 10 and mount substrate 20 may be performed automatically by software or operated manually based on the image displayed on the display unit 250.

Figure 4:
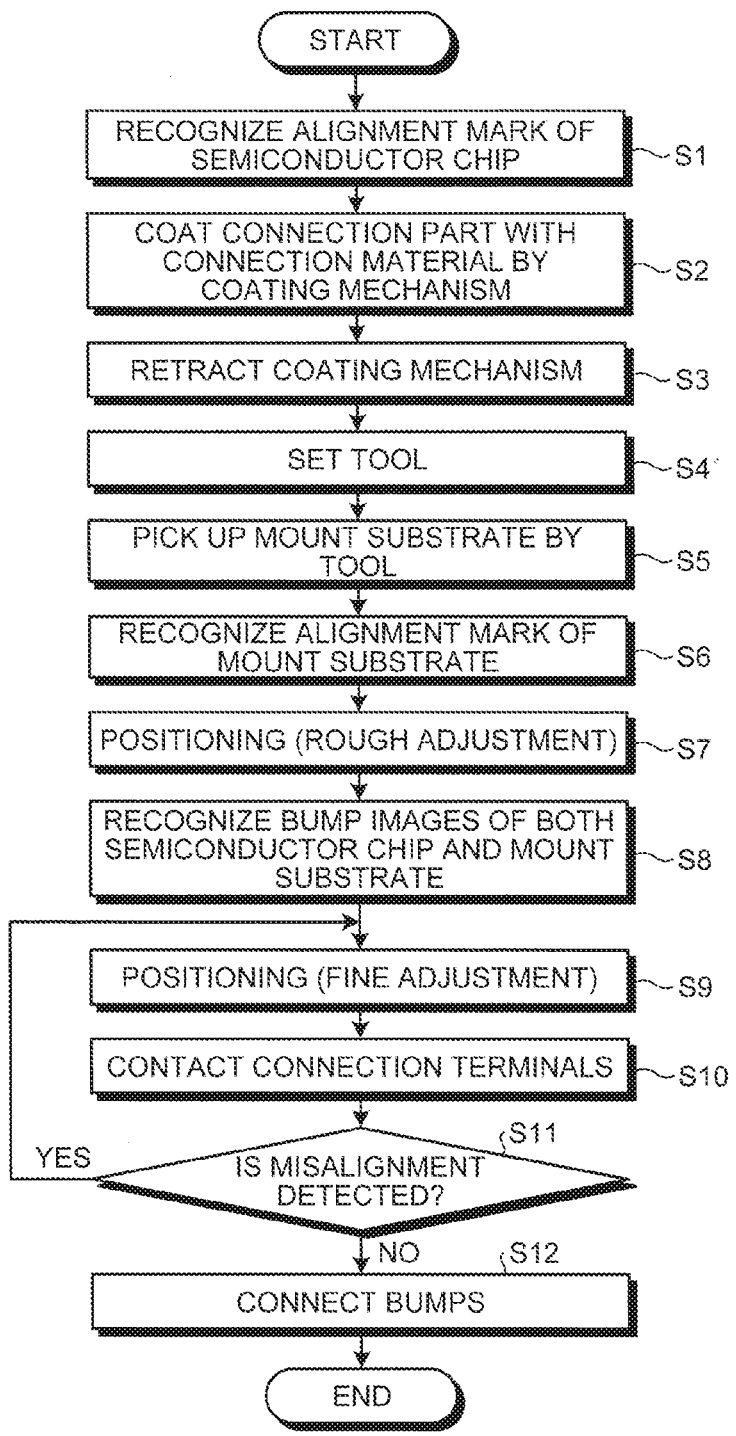
FIG. 4 is a flow chart illustrating a method of manufacturing the semiconductor device according to the first embodiment of the present invention.

Next, the method of manufacturing the semiconductor device 100 by using the positioning apparatus 200 will be described. FIG. 4 is a flow chart illustrating the method of manufacturing the semiconductor device 100 according to the first embodiment of the present invention.

First, by capturing, by the imaging device 210, an image of the alignment mark 13 of the semiconductor chip 10 fixed on the stage 230, the alignment mark 13 of the semiconductor chip 10 is recognized (step S1). By the recognition of the alignment mark 13 of the semiconductor chip 10, the positions of the semiconductor chip 10 and the first connection terminal 11 are recognized, and the connection material 15 is coated on the first connection terminal 11 of the semiconductor chip 10 by the coating mechanism (step S2).

After coating the connection material 15 and retracting the coating mechanism from above the semiconductor chip 10 (step S3), the tool 240 is set (step S4), and the mount substrate 20 is picked up by the tool 240 (step S5).

The alignment mark 22 of the mount substrate 20 held by the tool 240 is recognized through imaging by the imaging device 210 (step S6). By the recognized alignment mark 22 and the alignment mark 13 of the semiconductor chip 10 recognized in step S1, under the control of the control unit 220, the positions of the semiconductor chip 10 and mount substrate 20 are roughly adjusted by movement of the tool 240 (step S7).

After the rough adjustment by the alignment marks 13 and 22, the image 11a of the first connection terminal 11 and the image 21a of the second connection terminal 21, which are projected on the reflective surface 34, are captured by the imaging device 210 to be recognized (step S8). The control unit 220 performs pattern matching or the like on the image data captured by the imaging device 210 to thereby finely adjust the positions of the semiconductor chip 10 and mount substrate 20 (step S9).

After the fine adjustment of the positions, the first connection terminal 11 and second connection terminal 21 come into contact with each other by the movement of the tool 240 (step S10). If misalignment is detected after coming into contact (step S11: YES), fine adjustment of the positions at step S9 is performed again, and if no misalignment is detected (step S11: NO), the first connection terminal 11 and the second connection terminal 21 are connected to each other (step S12).

The semiconductor device 100 according to the first embodiment includes the optical reflective surface 34, which is a part of an outer surface of the prism 30, and is able to project the image 11a of the first connection terminal 11 and the image 21a of the second connection terminal 21 on the reflective surface 34, and thus, positioning that conventionally required two devices (top view and side view) is able to be performed by the single imaging device 210 arranged at the reverse side of the connection surface of the mount substrate 20. Further, since the semiconductor device 100 according to the first embodiment has the alignment marks 13 and 22, it becomes possible to perform positioning (rough adjustment) by the alignment marks 13 and 22 up to positions where the image 21a of the connection terminal 21 is projected on the reflective surface 34, and thereafter perform positioning by the images 11a and 21a projected on the reflective surface 34, and thus, fast and highly accurate positioning and connection between connection terminals become possible.

In the first embodiment, the alignment marks 13 and 22 are respectively formed in the semiconductor chip 10 and the mount substrate 20, and the positions of the semiconductor chip 10 and mount substrate 20 are roughly adjusted by the alignment marks 13 and 22, but without forming the alignment marks 13 and 22, positioning between the semiconductor chip 10 and the mount substrate 20 may be performed based only on the images 11a and 21a projected on the reflective surface 34. If the positioning between the semiconductor chip 10 and the mount substrate 20 is performed based only on the images 11a and 21a projected on the reflective surface 34, positioning in the Y-direction of FIG. 2 may be performed by pattern matching with respect to the positions of the images 11a and 21a projected on the reflective surface 34, and positioning in the X-direction may be performed by focus adjustment of the images 11a and 21a.

Second Embodiment

Figure 5:
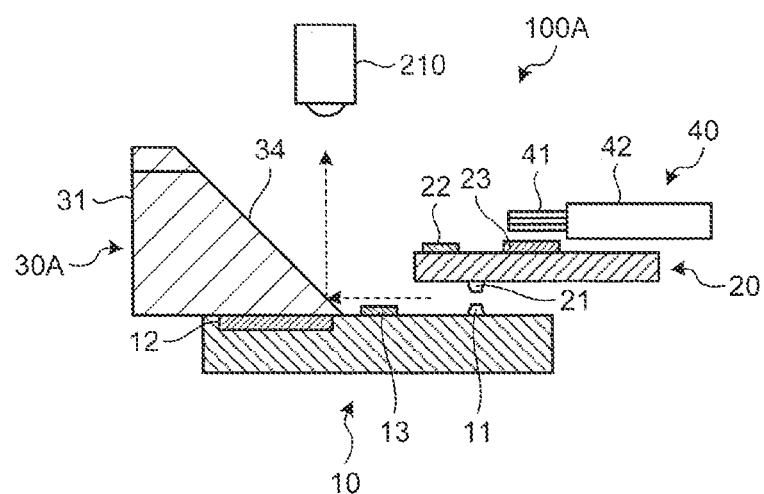
FIG. 5 is a cross section diagram illustrating positioning of a semiconductor device according to a second embodiment of the present invention.
Figure 6:
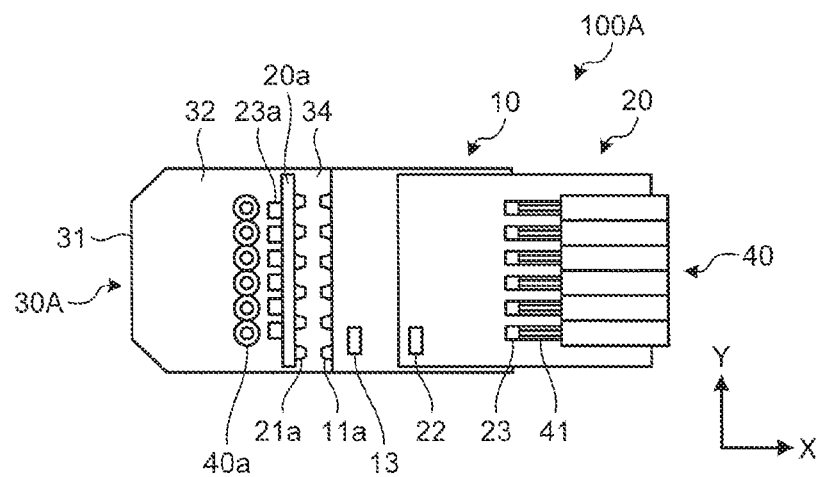
FIG. 6 is a top view illustrating positioning of the semiconductor device according to the second embodiment of the present invention.
Figure 7:
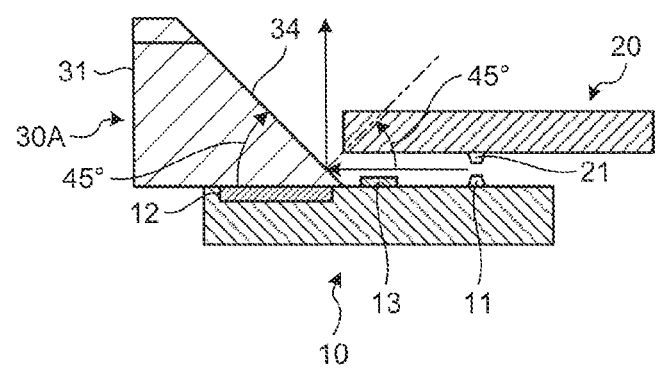
FIG. 7 is a diagram illustrating projection of an image of a connection part.

A semiconductor device 100A according to a second embodiment includes a transmission cable 40 connected on the reverse side of the connection surface, which is of the mount substrate 20 and which is connected to the semiconductor chip 10. FIG. 5 is a cross section diagram illustrating positioning of the semiconductor device 100A according to the second embodiment of the present invention. FIG. 6 is a top view illustrating the positioning of the semiconductor device 100A according to the second embodiment of the present invention. FIG. 7 is a diagram illustrating projection of an image of a connection part.

As illustrated in FIGS. 5 and 6, the semiconductor device 100A according to the second embodiment includes the transmission cable 40 connected on the reverse side of the connection surface, which is of the mount substrate 20 and which is connected to the semiconductor chip 10. The transmission cable 40 includes a core wire 41 formed of a conductor such as copper, and an insulation layer 42 that covers an outer periphery of the core wire 41.

On the reverse side of the connection surface of the mount substrate 20 to the semiconductor chip 10, a connection land 23 that connects the transmission cable 40 is formed. After being positioned on the connection land 23, the core wire 41 of the transmission cable 40 is connected by a non-illustrated electrically conductive joining member such as a solder, ACF, ACP, or the like.

The semiconductor device 100A according to the second embodiment is different from the semiconductor device 100 of the first embodiment in that only one prism 30A is used. In the second embodiment, because only one prism 30A is used, the reflective surface 34 is able to be secured largely. Thereby, in addition to the image 11a and image 21a of the first connection terminal 11 and second connection terminal 21, an image 23a of the connection land 23 of the mount substrate 20 and an image 40a of the transmission cable 40 are able to be projected on the reflective surface 34.

Further, as illustrated in FIG. 7, an angle of a slope of the prism 30A is freely settable, and thus reflected light is able to be reflected in any direction. The angle of the slope of the prism 30A is preferably 45°.

After performing positioning and connection of the semiconductor chip 10 and mount substrate 20 by using the reflective surface 34 similarly to the first embodiment, the semiconductor device 100A according to the second embodiment is manufactured by performing positioning and connection of an end portion of the exposed core wire 41 of the transmission cable 40, by using the reflective surface 34.

According to the second embodiment, even when the transmission cable 40 is also mounted on the mount substrate 20, highly accurate positioning is possible by using a reflected image. When an electronic part or the like other than the transmission cable 40 is mounted on the mount substrate 20 also, positioning using the reflective surface 34 is possible.

Third Embodiment

Figure 8:
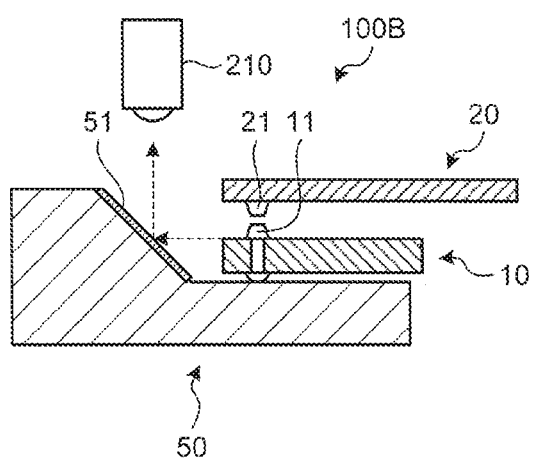
FIG. 8 is a cross section diagram illustrating positioning of a semiconductor device according to a third embodiment of the present invention.
Figure 9:
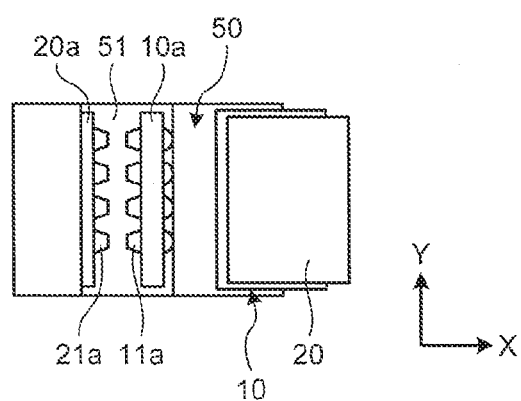
FIG. 9 is a top view illustrating positioning of the semiconductor device according to the third embodiment of the present invention.

In a semiconductor device 100B according to a third embodiment, a reflective surface 51 is formed on a base substrate 50 on which the semiconductor chip 10 is mounted, and the semiconductor chip 10 is connected to the mount substrate 20 at a reverse side of a connection surface of the semiconductor chip 10 to the base substrate 50. FIG. 8 is a cross section diagram illustrating positioning of the semiconductor device 100B according to the third embodiment of the present invention. FIG. 9 is a top view illustrating positioning of the semiconductor device 100B according to the third embodiment of the present invention.

In the semiconductor device 100B according to the third embodiment, the reflective surface 51 is formed on the base substrate 50 on which the semiconductor chip 10 is mounted. The reflective surface 51 has a reflective coat layer formed thereon, by forming a slope on the base substrate 50 and thereafter forming a vapor deposition film or the like of a metal on the slope.

In the semiconductor device 100B of the third embodiment, after positioning is performed according to the image 11a of the first connection terminal 11 of the semiconductor chip 10 and the image 21a of the second connection terminal 21 of the mount substrate 20, which are projected on the reflective surface 51, the first connection terminal 11 and the second connection terminal 21 are connected by the connection material.

In the semiconductor device 100B according to the third embodiment, by providing the reflective surface 51 on the base substrate 50 to be mounted with the semiconductor chip 10, highly accurate positioning becomes possible by just a single imaging device.

Figure 10:
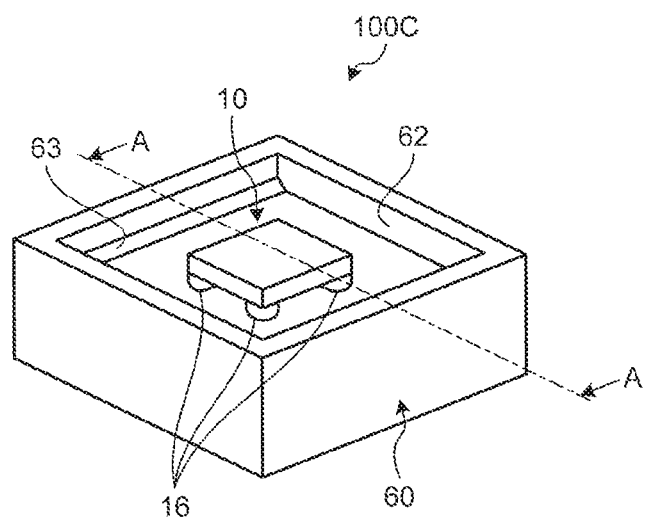
FIG. 10 is a perspective diagram illustrating a semiconductor device according to a modified example of the third embodiment of the present invention.
Figure 11:
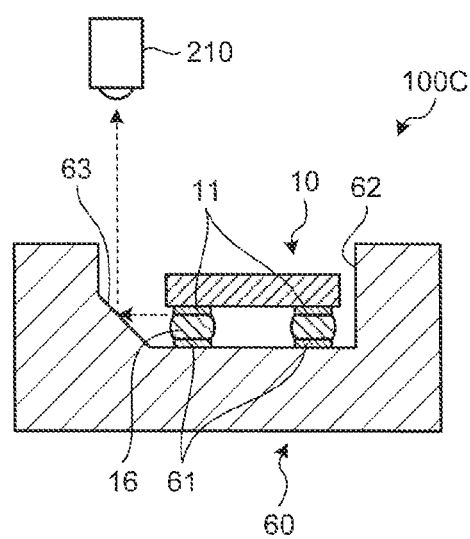
FIG. 11 is a cross section diagram along line A-A of the semiconductor device of FIG. 10.

The reflective surface may be formed on a substrate instead of the base substrate 50. FIG. 10 is a perspective diagram illustrating a semiconductor device 100C according to a modified example of the third embodiment of the present invention. FIG. 11 is a cross section diagram along line A-A of the semiconductor device 100C of FIG. 10.

The semiconductor device 100C according to the modified example includes: the semiconductor chip 10; a substrate 60 having a trench portion 62 in which the semiconductor chip 10 is mounted; and a reflective surface 63 formed in the trench portion 62. The reflective surface 63 is formed on one of side surfaces of the trench portion 62 and similarly to the third embodiment, after a slope is formed thereon, a reflective coat layer is formed thereon by a vapor deposition film or the like of metal. The substrate 60 serves as a relay substrate to be connected to one or two circuit boards.

In the semiconductor device 100C, after positioning according to the image of the first connection terminal 11 of the semiconductor chip 10 and an image of a second connection terminal 61 of the substrate 60, which are projected on the reflective surface 63, is performed, the first connection terminal 11 and the second connection terminal 61 are connected to each other by a connection material 16.

In the semiconductor device 100C according to the modified example of the third embodiment, by providing the reflective surface 63 on the base substrate 60 to be mounted with the semiconductor chip 10, highly accurate positioning becomes possible by a single imaging device.

As described above, the semiconductor device, the method of positioning the semiconductor device, and the positioning apparatus for the semiconductor device are useful for a semiconductor device that requires highly accurate positioning.

According to some embodiments, because positioning while visually recognizing the connection terminals projected on the reflective surfaces is possible, accurate positioning becomes possible.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A positioning system comprising:
   a semiconductor device comprising:
      a semiconductor chip having a plurality of first connection terminals for wiring connection and a first alignment mark on a connection surface to a substrate;
      the substrate having a plurality of second connection terminals for wiring connection on a first surface facing the connection surface of the semiconductor chip and having a second alignment mark on a second surface facing an opposition direction of the first surface, the first surface and the second surface being offset in a thickness direction of the substrate, the plurality of second connection terminals being electrically connected to the plurality of first connection terminals; and
      a reflective surface for reflecting light from the plurality of first connection terminals and the plurality of second connection terminals, the reflective surface being angled relative to the connection surface of the semiconductor chip such that light from the plurality of first connection terminals and light from the plurality of second connection terminals are reflected by the reflective surface in the thickness direction; and
   a positioning apparatus comprising:
      a stage configured to fix the semiconductor chip and configured to be movable within one plane;
      a tool configured to suction and fix the substrate, and configured to mount the substrate on the semiconductor chip;
      an imaging sensor configured to image the reflective surface to capture images of the plurality of first connection terminals and the plurality of second connection terminals projected on the reflective surface and reflected in the thickness direction, and configured to capture images of the first alignment mark and the second alignment mark without using the reflective surface; and a controller comprising hardware, the controller being configured to control movement of the stage based on the images of the plurality of first connection terminals and the plurality of second connection terminals projected on the reflective surface and captured by the imaging sensor, and based on the images of the first alignment mark and the second alignment mark captured by the imaging sensor.

2. The positioning apparatus according to claim 1, wherein the controller is configured to perform positioning of at least one of the substrate and the semiconductor chip in an array direction of the images of the plurality of first connection terminals and the plurality of second connection terminals projected on the reflective surface by pattern matching with respect to positions of the images of the plurality of first connection terminals and the plurality of second connection terminals projected on the reflective surface.

3. The positioning apparatus according to claim 1, wherein the controller is configured to perform positioning of at least one of the substrate and the semiconductor chip in a direction orthogonal to an array direction of the images of the plurality of first connection terminals and the plurality of second connection terminals projected on the reflective surface by focus adjustment of the images of the plurality of first connection terminals and the plurality of second connection terminals projected on the reflective surface.

* * * * *